US010750619B2

(12) United States Patent
Yen

(10) Patent No.: US 10,750,619 B2
(45) Date of Patent: Aug. 18, 2020

(54) METALLIZATION STRUCTURE AND MANUFACTURING METHOD THEREOF

(71) Applicant: INDUSTRIAL TECHNOLOGY RESEARCH INSTITUTE, Hsinchu (TW)

(72) Inventor: Ming-Huei Yen, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 9 days.

(21) Appl. No.: 15/851,054

(22) Filed: Dec. 21, 2017

(65) Prior Publication Data

US 2019/0200459 A1 Jun. 27, 2019

(51) Int. Cl.
*H05K 1/09* (2006.01)
*H05K 3/18* (2006.01)
(Continued)

(52) U.S. Cl.
CPC .......... *H05K 3/185* (2013.01); *C23C 18/1605* (2013.01); *C23C 18/1608* (2013.01);
(Continued)

(58) Field of Classification Search
CPC .......... H05K 3/185; H05K 1/09; H05K 3/184; H05K 2201/0338; H05K 2201/0326;
(Continued)

(56) References Cited

U.S. PATENT DOCUMENTS 8,658,488 B2 2/2014 Dimitrakopoulos et al.
9,105,696 B1* 8/2015 Dow ................. H01L 21/02057
(Continued)

FOREIGN PATENT DOCUMENTS

CN 103956354 A 7/2014
CN 104576515 A 4/2015
(Continued)

OTHER PUBLICATIONS

Bong et al., "Ultrathin Graphene and Graphene Oxide Layers as a Diffusion Barrier for Advanced Cu Metallization," Appl. Phys. Lett., vol. 106, No. 6, 2015 (Published online Feb. 13, 2015), pp. 063112-1 to 063112-5 (Total 6 pages).
(Continued)

*Primary Examiner* — Ishwarbhai B Patel
(74) *Attorney, Agent, or Firm* — Birch, Stewart, Kolasch & Birch, LLP

(57) ABSTRACT

Graphene oxide is used as an insulation barrier layer for metal deposition. After patterning and modification, the chemical characteristics of graphene oxide are induced. It can be used as the catalyst for electroless plating in the metallization process, so that the metal is only deposited on the patterned area. It provides the advantages of improving reliability and yield. The metallization structure includes a substrate, a graphene oxide catalytic layer, and a metal layer. It may be widely applied to the metallization of the fine pitch metal of a semiconductor package as well as the fine pitch wires of a printed circuit board (PCB), touch panels, displays, fine electrodes of solar cells, and so on.

6 Claims, 7 Drawing Sheets

(51) Int. Cl.
  *C23C 18/16* (2006.01)
  *C23C 18/18* (2006.01)
  *H01L 23/532* (2006.01)
  *H01L 21/768* (2006.01)
  *H01L 21/288* (2006.01)
  *H01L 21/48* (2006.01)
  *H01L 23/498* (2006.01)
  *C23C 18/20* (2006.01)

(52) U.S. Cl.
  CPC ...... *C23C 18/1612* (2013.01); *C23C 18/1639* (2013.01); *C23C 18/1893* (2013.01); *H05K 1/09* (2013.01); *H05K 3/184* (2013.01); *C23C 18/1844* (2013.01); *C23C 18/2086* (2013.01); *H01L 21/288* (2013.01); *H01L 21/4846* (2013.01); *H01L 21/76843* (2013.01); *H01L 21/76867* (2013.01); *H01L 21/76874* (2013.01); *H01L 21/76885* (2013.01); *H01L 23/49866* (2013.01); *H01L 23/53209* (2013.01); *H01L 23/53228* (2013.01); *H01L 23/53242* (2013.01); *H05K 2201/0326* (2013.01); *H05K 2201/0338* (2013.01); *H05K 2203/072* (2013.01)

(58) Field of Classification Search
  CPC .. H05K 2203/072; H05K 1/092; H05K 1/095; H05K 1/097; C23C 18/1639; H01L 23/49866; H01L 21/76885; H01L 21/76867; H01L 21/76874; H01L 21/4846; H01L 21/288; H01L 23/53209; H01L 21/76843
  See application file for complete search history.

(56) References Cited

U.S. PATENT DOCUMENTS

| | | | | |
|---|---|---|---|---|
| 9,219,008 | B2 * | 12/2015 | Matsumoto | H01L 23/53276 |
| 2011/0070146 | A1 * | 3/2011 | Song | B82Y 30/00 |
| | | | | 423/448 |
| 2013/0203246 | A1 | 8/2013 | Dimitrakopoulos et al. | |
| 2014/0027161 | A1 * | 1/2014 | Lee | H05K 1/09 |
| | | | | 174/257 |
| 2014/0295080 | A1 * | 10/2014 | Cho | C23C 16/26 |
| | | | | 427/249.6 |
| 2014/0339708 | A1 | 11/2014 | Jang et al. | |
| 2016/0067680 | A1 | 3/2016 | Matsumoto et al. | |

FOREIGN PATENT DOCUMENTS

| | | |
|---|---|---|
| TW | 201133748 A1 | 10/2011 |
| TW | 201332405 A1 | 8/2013 |
| TW | 201536964 A | 10/2015 |
| TW | I522499 B | 2/2016 |
| TW | 201717425 A | 5/2017 |
| TW | I586849 B | 6/2017 |
| WO | WO 2013/096273 A1 | 6/2013 |

OTHER PUBLICATIONS

Chen et al., "Synthesis of "Clean" and Well-Dispersive Pd Nanoparticles with Excellent Electrocatalytic Property on Graphene Oxide," Journal of the American Chemical Society, vol. 133, 2011 (Published Feb. 24, 2011), pp. 3693-3695.

Dreyer et al., "The Chemistry of Graphene Oxide," Chemical Society Reviews, vol. 39, 2010, (First published as an Advance Article on the web Nov. 3, 2009), pp. 228-240.

Gao et al., "Novel Strategy for Preparation of Graphene-Pd, Pt Composite, and Its Enhanced Electrocatalytic Activity for Alcohol Oxidation," Journal of the American Chemical Society, vol. 29, 2013 (Published Dec. 21, 2012), pp. 957-964.

Hummers et al., "Preparation of Graphitic Oxide," Journal of the American Chemical Society, vol. 80, No. 6, Contribution from the Baroid Division, National Lead Company, Mar. 20, 1958, p. 1339.

Zhang et al., "Fabrication of Gold Nanoparticle/Graphene Oxide Nanocomposites and their Excellent Catalytic Performance," J. Mater. Chem., vol. 21, 2011 (Published Jun. 28, 2011), pp. 11080-11083.

Taiwanese Office Action and Search Report, dated Nov. 8, 2018, for Taiwanese Application No. 106145043.

* cited by examiner

METALLIZATION STRUCTURE AND MANUFACTURING METHOD THEREOF

TECHNICAL FIELD

The disclosure relates to a metallization structure and manufacturing method thereof.

BACKGROUND

As electronic products are being developed in ways that make them lighter, thinner, smaller and more multi-functional, the functions of chips and packages are increasing. The demand for high-density circuit will be unavoidable. The shrinkage of line pitch has become a major challenge. Traditional metallization processes for fine pitch metal include conducting-layer deposition, lithography, electroplating, and etching. The whole process uses up a lot of materials, chemical solvents and water resources. Therefore, the harm being done to the environment is a worry for the future development of the electronics industry.

A semi-additive method is currently used in the metallization process. The barrier/seed layer is deposited by a physical vapor deposition (PVD) method. After formation of the circuit, a wet etching process is used to remove the unwanted barrier and/or seed layer.

As the pitch of the circuit shrinks, incomplete etching or over-etching may be cause issues with reliability and yield.

Accordingly, a novel metallization structure for the current field of patterned metallization of fine pitch circuit is called for.

SUMMARY

An embodiment of the disclosure provides a metallization structure, including a substrate; a graphene oxide catalytic layer; and a metal layer, wherein the graphene oxide catalytic layer is disposed between the substrate and the metal layer.

Another embodiment of the disclosure provides a metallization structure, including a substrate; a graphene oxide layer, disposed on the substrate; a graphene oxide catalytic layer; and a metal layer, wherein the graphene oxide catalytic layer is disposed between the graphene oxide layer and the metal layer.

Still another embodiment of the disclosure provides a method for forming the metallization structure, comprising: providing a substrate; forming a graphene oxide layer on the substrate; modifying the graphene oxide layer to form a graphene oxide catalytic layer; and performing a metallization process on the graphene oxide catalytic layer.

A detailed description is given in the following embodiments with reference to the accompanying drawings.

BRIEF DESCRIPTION OF DRAWINGS

The present disclosure can be more fully understood by reading the subsequent detailed description and examples with references made to the accompanying drawings, wherein.

DETAILED DESCRIPTION

Figure 1:
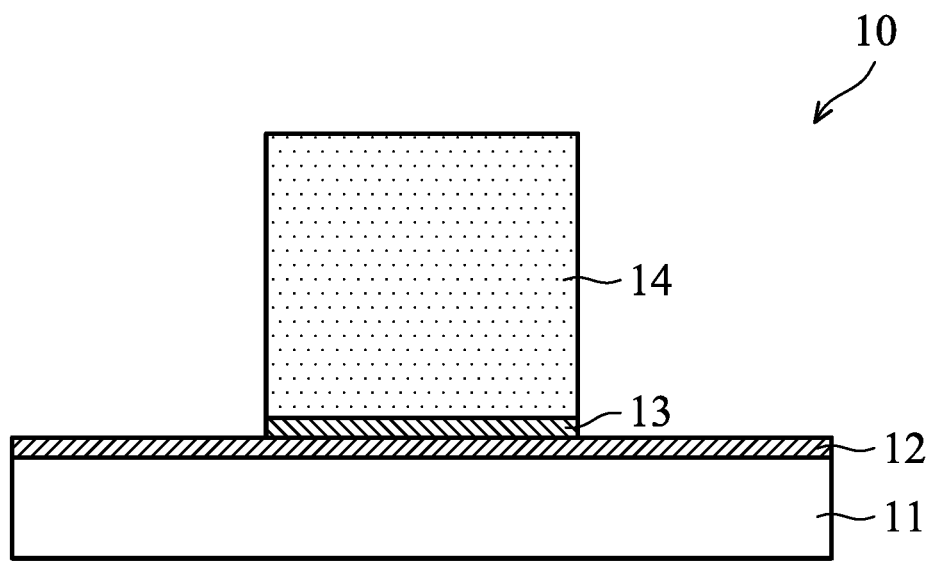
FIG. 1 illustrates a schematic view of a metallization structure in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The term "an embodiment" in the following context means a particular pattern, structure, or feature described in connection with at least one embodiment of the present disclosure. Therefore, the following description of "in an embodiment" does not refer to the same embodiment. In addition, the particular patterns, structures, or features in one or more embodiments may be combined in any suitable manner. It should be noted that, in the drawings, the size of some of the elements may be exaggerated for illustrative purposes and are not drawn to scale. The dimensions and the relative dimensions do not correspond to actual dimensions in the practice of the disclosure.

The present disclosure uses graphene oxide as an insulation barrier layer for metal deposition. After patterning and modification, the chemical characteristics of a patterned area of the graphene oxide are induced and can be used as the catalyst for electroless plating. Therefore, the metal is only deposited on the patterned area and completes the metallization process.

In some embodiments of the present disclosure, the graphene oxide is used as an insulation barrier layer and a seed layer. Referring to FIG. 1, a metallization structure 10 is provided. The metallization structure 10 includes a substrate 11, a graphene oxide layer 12, a graphene oxide catalytic layer 13, and a metal layer 14. The graphene oxide catalytic layer 13 is disposed between the substrate 11 and the metal layer 14. In this embodiment, a patterned structure is disposed above the substrate 11, wherein the patterned structure is composed of the graphene oxide catalytic layer 13 and the metal layer 14. In one embodiment, the substrate 11 is an insulation material or a semiconductor material. In this embodiment, the graphene oxide layer 12 is used as an insulation barrier layer, and the graphene oxide catalytic layer 13 is used as an electroplating seed layer for thickening the metal layer 14. Alternatively, in another embodiment, the metallization may be completed by performing, for example, an electroless plating directly on the graphene oxide catalytic layer 13.

Figure 2:
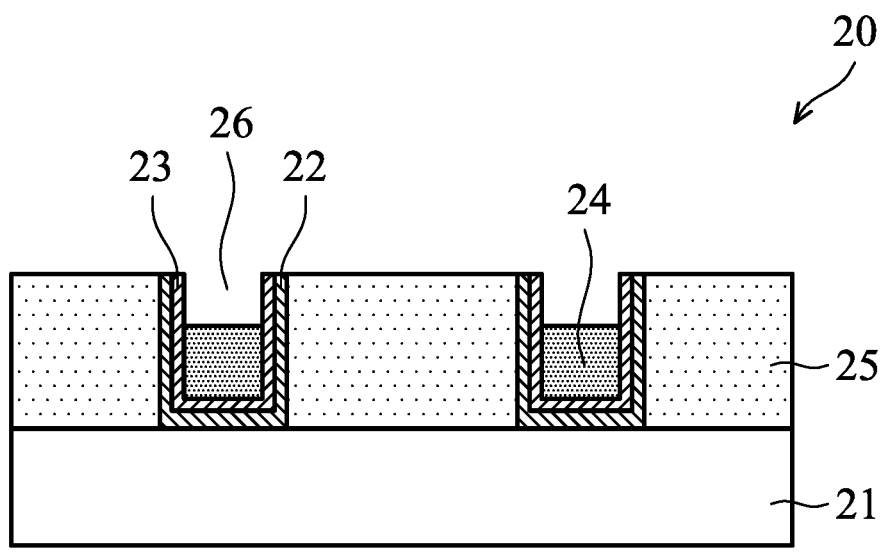
FIG. 2 illustrates a schematic view of a patterned metallization structure in accordance with another embodiment of the present disclosure.

FIG. 2 illustrates another patterned metallization structure 20 in accordance with another embodiment of the present disclosure. The patterned metallization structure 20 includes a substrate 21, a graphene oxide catalytic layer 23, a metal layer 24, and a dielectric layer 25. The dielectric layer 25 is disposed on the substrate 21 and has patterned first openings 26. The graphene oxide catalytic layer 23 is disposed on the inner edge of the first openings 26 and is in contact with the dielectric layer 25 and the substrate 21. In this embodiment, a patterned structure is disposed above the substrate 21, wherein the patterned structure is composed of the graphene oxide catalytic layer 23, the metal layer 24, and the dielectric layer 25. In one embodiment, the substrate 21 is an insulation material or a semiconductor material. It should be noted that there may be a graphene oxide layer 22 disposed between the graphene oxide catalytic layer 23 and the dielectric layer 25. When there is a graphene oxide layer 22, the graphene oxide layer 22 is in contact with the dielectric layer 25 and the substrate 21. Also, in such cases, the graphene oxide catalytic layer 23 is disposed between the graphene oxide layer 22 and the metal layer 24. In this embodiment, a patterned structure is disposed above the substrate 21, wherein the patterned structure is composed of the graphene oxide layer 22, the graphene oxide catalytic layer 23, the metal layer 24, and the dielectric layer 25. It should be noted that the graphene oxide catalytic layer 23 and graphene oxide layer 22 do not have to exist at the same time.

The graphene oxide catalytic layer is formed by performing a surface modification of the graphene oxide layer by using a metal complex. In other words, during the surface modification of the graphene oxide layer, a redox reduction is induced and a metal deposition is occurred, thereby forming the graphene oxide catalytic layer. During the surface modification, the deposited metal may permeate into the graphene oxide layer. The graphene oxide layer permeated with metal is also considered as the graphene oxide catalytic layer in the present disclosure. Therefore, after the surface modification, the original graphene oxide layer may be replaced by the graphene oxide catalytic layer. Alternatively, after the surface modification, the graphene oxide catalytic layer and the graphene oxide layer may exist at the same time. The drawings of the present disclosure only illustrate cases in which the graphene oxide catalytic layer and the graphene oxide layer exist at the same time. However, it is not intended to be limiting.

In some embodiments, the substrate used in the present disclosure may be made of ceramic materials such as oxides, nitrides, glass, polymers, silicon wafers and so on. In some embodiments, the material of the metal layer may be nickel and its alloys, copper, cobalt, gold, silver, tin, and so on. The metallization structure of the present disclosure may be widely applied to the metallization of fine pitch of semiconductor and its package, fine pitch wires of printed circuit board (PCB), touch panels, displays, fine electrodes of solar cells, and so on.

In the present disclosure, graphene oxide was prepared in the manner described by Hummer's method (J. Am. Chem. Soc., 1958, 80 (6), 1339).

0.5 g of graphite powder and 0.5 g of sodium nitrate were added to 23 ml of 98% concentrated sulfuric acid and stirred in an ice-water bath. After thorough mixing, 3 g of potassium permanganate was slowly added and stirred in an ice-water bath for 15 minutes. The solution was heated to 35° C. and the temperature was kept for 30 minutes. Then, 46 ml of pure water was slowly added. The solution was heated to 98° C. and the temperature was maintained for 15 minutes. Finally, 140 ml of pure water was added for dilution and 25 ml of 30% hydrogen peroxide was added to stop the reaction.

Figure 3A:
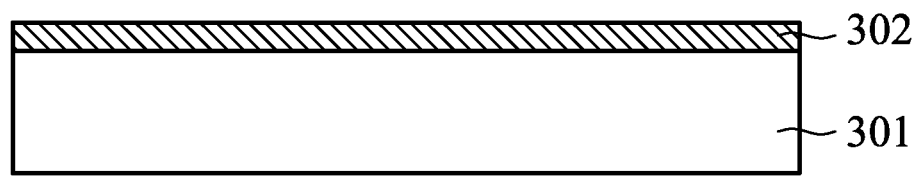
FIG. 3A illustrates a cross section of a metallization structure during the manufacturing method for forming the metallization structure in accordance with an embodiment of the present disclosure.
Figure 3B:
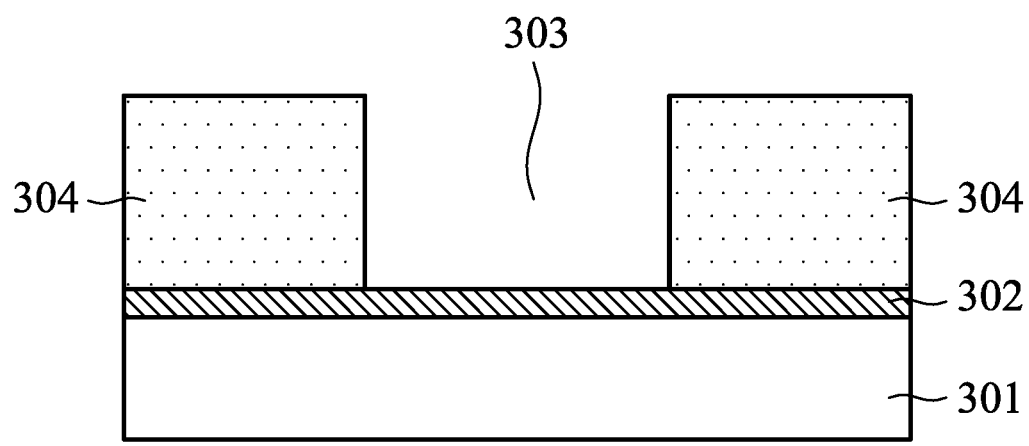
FIG. 3B illustrates a cross section of a metallization structure during the manufacturing method for forming the metallization structure in accordance with an embodiment of the present disclosure.
Figure 3C:
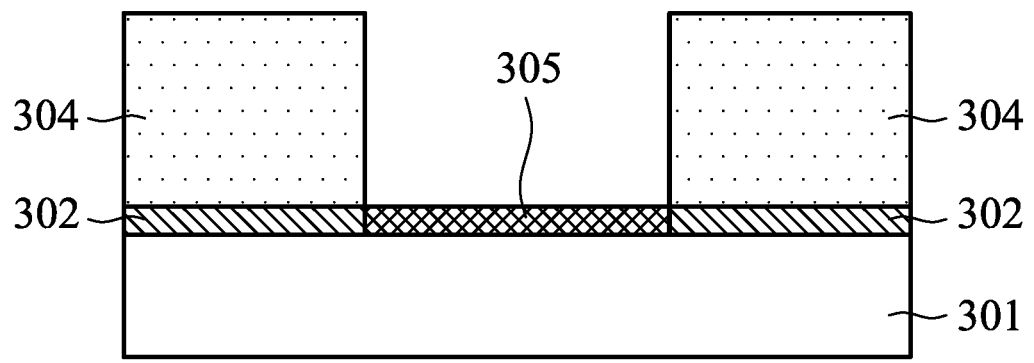
FIG. 3C illustrates a cross section of a metallization structure during the manufacturing method for forming the metallization structure in accordance with an embodiment of the present disclosure.
Figure 3D:
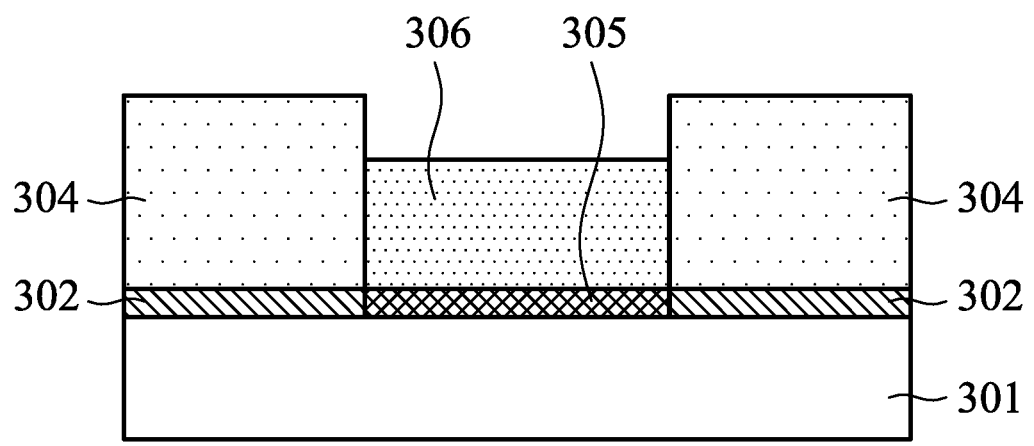
FIG. 3D illustrates a cross section of a metallization structure during the manufacturing method for forming the metallization structure in accordance with an embodiment of the present disclosure.
Figure 3E:
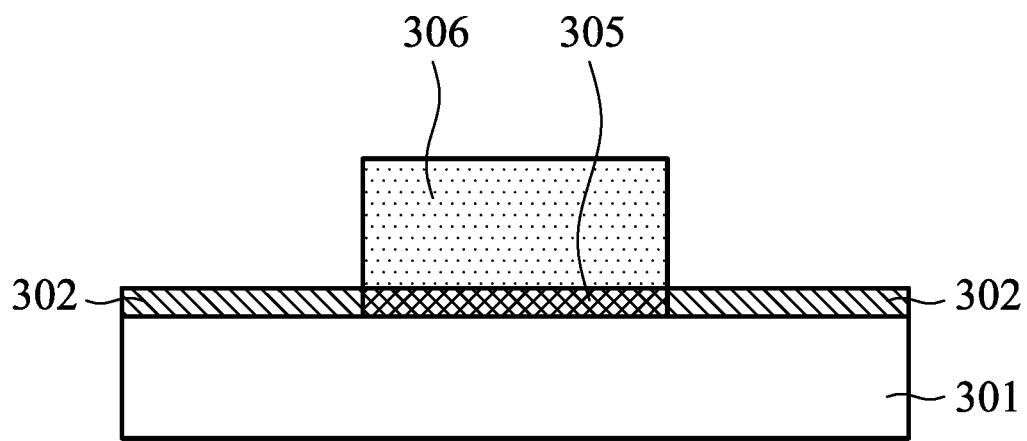
FIG. 3E illustrates a cross section of a metallization structure during the manufacturing method for forming the metallization structure in accordance with an embodiment of the present disclosure.

The following describes the method for manufacturing the metallized structure according to an embodiment of the present disclosure in cooperation with FIG. 3A to FIG. 3E. First, referring to FIG. 3A, a substrate 301 was provided. The substrate 301 may be ceramic materials such as oxides or nitrides, glass, polymers, silicon wafers and so on. In one embodiment of the present disclosure, the substrate 301 is glass. Then, a graphene oxide layer 302 is formed on the substrate 301. The method for forming the graphene oxide layer 302 may be sputtering method, coating method, spin coating method, knife coating method, slit die coating method, roll coating method, dip coating method, immersion method, chemical vapor deposition (CVD) method, and so on. Referring to FIG. 3B, a mask 304 with a second opening 303 is provided on the substrate 301 which includes the graphene oxide layer 302 to form a pattern. Thereafter, referring to FIG. 3C, a metal complex is used to modify the graphene oxide layer 302 in the second opening 303 to form a graphene oxide catalytic layer 305. Examples of the modification method for the graphene oxide layer 302 include an ultrasonic method, an impregnation method, a thermal treatment method, a microwave method, a UV light irradiation method, an electrochemical method, and a high pressure method. The metal complex may be precious metal complexes such as copper complex, gold complex, nickel complex, silver complex, palladium complex, platinum complex, or rhodium complex. In one embodiment of the present disclosure, the graphene oxide layer 302 is modified by using palladium ion complexes ($PdCl_4^{2-}$, $Pd(NH_3)_4Cl_2$, PdCl$_6^{2-}$, Pd(acac)$_2$, Pd(OAc)$_2$) or silver ion complexes (Ag$^+$, [Ag(NH$_3$)]$^+$, Ac—Ag). Then, referring to FIG. 3D, a metallization process is performed on the second opening 303 to form a metal layer 306. Thereafter, referring to FIG. 3E, the mask 304 is removed.

Figure 4A:
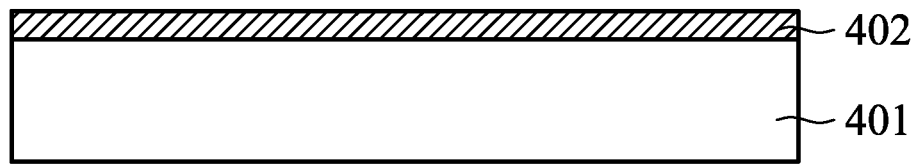
FIG. 4A illustrates a cross-sectional view of intermediate stages of a method for fabricating the metallization structure in accordance with another embodiment of the present disclosure.
Figure 4B:
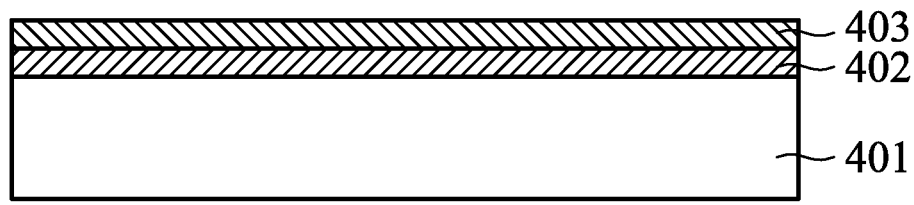
FIG. 4B illustrates a cross-sectional view of intermediate stages of a method for fabricating the metallization structure in accordance with another embodiment of the present disclosure.
Figure 4C:
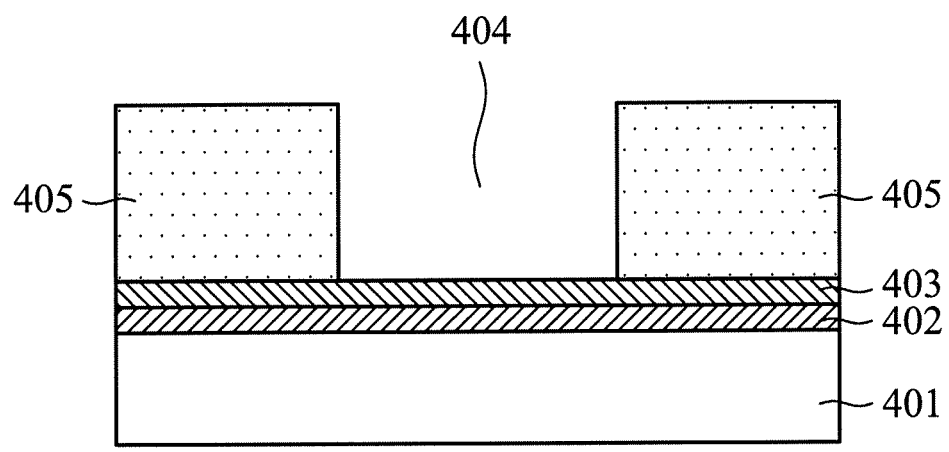
FIG. 4C illustrates a cross-sectional view of intermediate stages of a method for fabricating the metallization structure in accordance with another embodiment of the present disclosure.
Figure 4D:
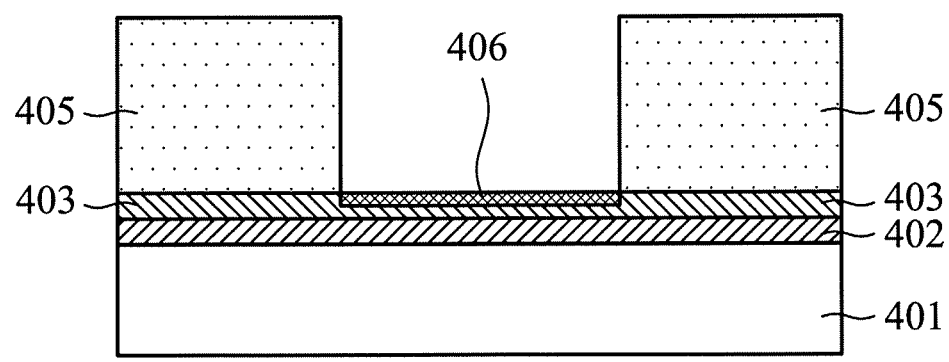
FIG. 4D illustrates a cross-sectional view of intermediate stages of a method for fabricating the metallization structure in accordance with another embodiment of the present disclosure.
Figure 4E:
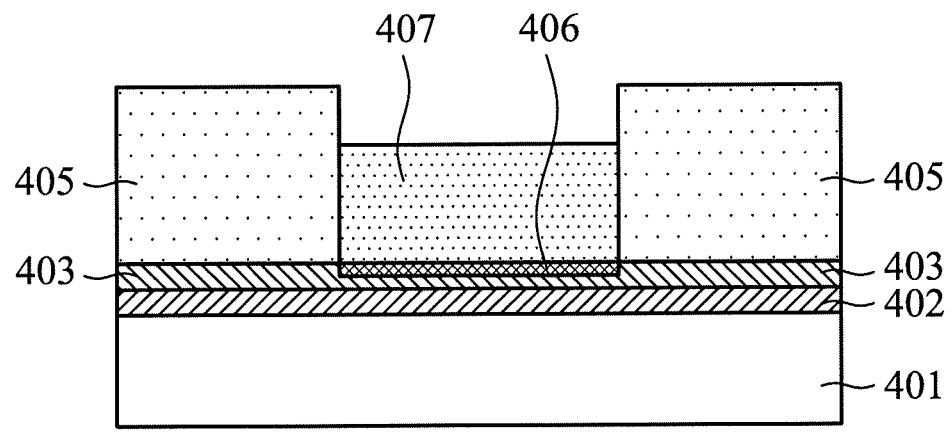
FIG. 4E illustrates a cross-sectional view of intermediate stages of a method for fabricating the metallization structure in accordance with another embodiment of the present disclosure.
Figure 4F:
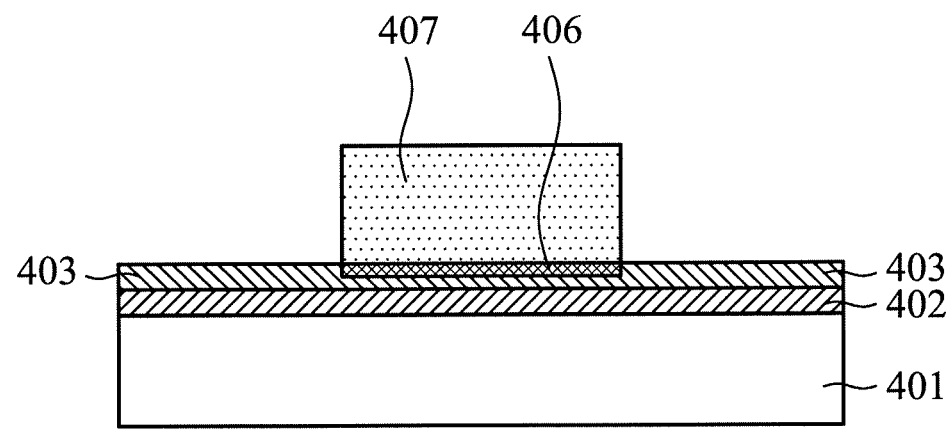
FIG. 4F illustrates a cross-sectional view of intermediate stages of a method for fabricating the metallization structure in accordance with another embodiment of the present disclosure.

In another embodiment, referring to FIG. 4A to FIG. 4F, a passivation layer 402 (or a protective layer, or a dielectric layer) is formed on the substrate 401. Then, a graphene oxide layer 403 is formed on the passivation layer 402. Referring to FIG. 4C, a mask 405 with a third opening 404 is provided on the substrate 401 which includes the passivation layer 402 and the graphene oxide layer 403 to form a pattern. Thereafter, referring to FIG. 4D, a metal complex is used to modify the graphene oxide layer 403 in the third opening 404 to form a graphene oxide catalytic layer 406. Then, referring to FIG. 4E, a metallization process is performed on the third opening 404 to form a metal layer 407. Thereafter, referring to FIG. 4F, the mask 405 is removed.

In some embodiments, the thickness of the graphene oxide catalytic layer may be ranging from 0.5 nm to 100 nm. For example, in some embodiments, the thickness of the graphene oxide catalytic layer may be ranging from 0.7 nm to 50 nm. It should be noted that, if the graphene oxide layer and graphene oxide catalytic layer exist at the same time, the total thickness of the graphene oxide layer and graphene oxide catalytic layer may range from 0.5 nm to 100 nm. For example, in some embodiments, the total thickness of the graphene oxide layer and graphene oxide catalytic layer may range from 0.7 nm to 50 nm.

According to the above description, the present disclosure uses graphene oxide as an insulation barrier layer, and a specific area of the graphene oxide is modified to induce a redox reaction, resulting metal deposition and forming a graphene oxide catalyst layer. The graphene oxide catalyst layer can be used as a seed layer. The metallization structure provided by the present disclosure has the following advantages: elimination of an etching process, avoidance of warpage, reduction of undercut, reduction the formation of poor metal profile or wire collapse, and so on. Also, the method provided by the present disclosure can be used to prepare fine pitch wire metallization, improve the reliability and yield.

In one embodiment of the present disclosure, a metallization structure is provided. The metallization structure includes a substrate, a graphene oxide and graphene oxide catalytic layer, and a metal layer, wherein the graphene oxide catalytic layer is disposed between the substrate and the metal layer. In some embodiments, the substrate may be an insulation material or a semiconductor material. In some embodiments, the metallization structure of the present disclosure may further include a graphene oxide layer, disposed between the substrate and the graphene oxide catalytic layer.

In another embodiment of the present disclosure, a patterned metallization structure is provided. The patterned metallization structure includes a substrate, a graphene oxide catalytic layer, a metal layer, and a dielectric layer. The dielectric layer is disposed in the substrate and has patterned openings. The graphene oxide catalytic layer is disposed on the inner edge of the openings. The substrate may be an insulation material or a semiconductor material. In some embodiments, the patterned metallization structure of the present disclosure may further include a graphene oxide layer, disposed between the graphene oxide catalytic layer and the dielectric layer and/or between the graphene oxide catalytic layer and the substrate.

In some embodiments of the present disclosure, a metal diffusion barrier layer, a passivation layer, or a protective layer may be further formed on the substrate which includes a patterned structure or not.

In another embodiment of the present disclosure, a method for forming the metallization structure is also provided. The method includes providing a substrate, forming a graphene oxide layer on the substrate; modifying the graphene oxide layer to form a graphene oxide catalytic layer; and performing a metallization process on the graphene oxide catalytic layer.

It will be apparent to those skilled in the art that various modifications and variations can be made to the disclosed embodiments. It is intended that the specification and examples be considered as exemplary only, with the true scope of the disclosure being indicated by the following claims and their equivalents.

What is claimed is:

1. A metallization structure, comprising:
   a substrate;
   a graphene oxide layer, disposed on the substrate;
   a graphene oxide catalytic layer, wherein the graphene oxide catalytic layer consists of a graphene oxide permeated with a metal; and
   a metal layer,
   wherein the graphene oxide catalytic layer is disposed between the graphene oxide layer and the metal layer.

2. The metallization structure as claimed in claim 1, wherein the total thickness of the graphene oxide layer and the graphene oxide catalytic layer is in a range from 0.5 nm to 100 nm.

3. The metallization structure as claimed in claim 1, wherein the substrate is an insulation material or a semiconductor material.

4. The metallization structure as claimed in claim 1, wherein a patterned structure is disposed above the substrate, wherein the patterned structure is composed of the graphene oxide layer, the graphene oxide catalytic layer, and the metal layer.

5. The metallization structure as claimed in claim 4, wherein the patterned structure further comprises a dielectric layer.

6. The metallization structure as claimed in claim 4, further comprising a passivation layer disposed between the substrate and the patterned structure.

* * * * *